United States Patent
Mizuno

(10) Patent No.: US 6,403,983 B1
(45) Date of Patent: Jun. 11, 2002

(54) QUANTUM WELL TYPE LIGHT-EMITTING DIODE

(75) Inventor: Yoshiyuki Mizuno, Nagoya (JP)

(73) Assignee: Daido Tokushuko Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/538,376

(22) Filed: Mar. 29, 2000

(30) Foreign Application Priority Data

Apr. 15, 1999 (JP) ............................................. 11-107865

(51) Int. Cl.$^7$ ................................................. H01L 27/15
(52) U.S. Cl. ........................................... 257/79; 257/77
(58) Field of Search ............................. 257/79, 77, 84, 257/103, 12–14, 190

(56) References Cited

FOREIGN PATENT DOCUMENTS

| JP | 4-167484 | | 6/1992 |
| JP | 10-027945 | | 1/1998 |
| JP | 10027945 | * | 1/1998 |
| JP | 11-054846 | | 2/1999 |
| JP | 11054846 | * | 9/1999 |

OTHER PUBLICATIONS

Singh, Semiconductor Devices Basics Principles, 2001, 1st Ed., Wiley, New York, p. 473.*
Comprehensive Dictionary of Electrical Engineering, 1999, IEEE Press, USA, p. 613.*

* cited by examiner

Primary Examiner—Fetsum Abraham
Assistant Examiner—Leonardo Anduújar
(74) Attorney, Agent, or Firm—Oblon, Spivak, McClelland, Maier & Neustadt, P.C.

(57) ABSTRACT

A quantum well type light-emitting diode having a light-emitting portion and formed of a plurality of semiconductor layers including at least one light-generating layer of a quantum well structure for generating a light, and a pair of reflecting layers between which the at least one light-generating layer is interposed for reflecting the light generated by the at least one light-generating layer, so that the pair of reflecting layers functions as a light resonator, the quantum well type light-emitting diode emitting the light generated by the light-generating layer from the light-emitting portion, wherein the improvement comprises: each of the at least one light-generating layer having a lattice constant which is smaller than that of at least two semiconductor layers of the plurality of semiconductor layers, which two semiconductor layers are located adjacent to and on opposite sides of the at least one light-generating layer.

12 Claims, 3 Drawing Sheets

QUANTUM WELL TYPE LIGHT-EMITTING DIODE

The present application is based on Japanese Patent Application No. 11-107865 filed Apr. 15, 1999, the contents of which are incorporated hereinto by reference.

BACKGROUND OF THE INVENTION

1. Field of the Invention

The present invention relates to an improvement of a quantum well type light-emitting diode (LED) having at least one light-generating layer of a quantum well structure and a light resonator which is constituted by a pair of reflecting layers between which the light-generating layer is interposed.

2. Discussion of the Related Art

There has been known a quantum well type light-emitting diode formed of a plurality of semiconductor layers which are laminated on a semiconductor substrate, wherein the plurality of semiconductor layers include at least one light-generating layer of a quantum well structure which generates a light and has a thickness value smaller than the wavelength (100 Å, i.e., 10 nm) of the electron wave, and a light resonator consisting of a pair of reflecting layers which are located on the opposite sides of the light-generating layer, for reflecting the light generated by the light-generating layer. By applying an electric current between two electrodes respectively formed on opposite two major surfaces of a laminar structure consisting of the plurality of semiconductor layers, the light generated by the light-generating layer is emitted from one of the two opposite major surfaces of the laminar structure which is remote from the substrate. In the thus constructed quantum well type light-emitting diode, the electron wave in the light-generating layer and the optical wave in the light resonator are coupled together, so that the light-generating layer generates a light only in a resonance mode. This phenomenon is generally referred to as cavity QED effect. Owing to this cavity QED effect, the above-described light-emitting diode is capable of emitting a light which has a high degree of directivity and a narrow line width, so that the emitted light does not suffer from total reflection on the crystal face, assuring a high degree of external quantum efficiency. Examples of such a light-emitting diode are disclosed in JP-A-4-167484 and JP-A-10-27945.

The above-described quantum well type light-emitting diode having the light resonator in which there is disposed the light-generating layer of a quantum well structure is capable of assuring a high degree of external quantum efficiency. This light-emitting diode, however, undesirably tends,to cause continuously induced or stimulated emission in the light resonator when a relatively large magnitude of electric current is applied to the diode for improving its light emission output. Accordingly, the light-emitting diode constructed as described above is likely to cause laser oscillation for the following reasons.

Described more specifically, when the plurality of semiconductor layers are formed by crystal growth on the substrate, the lattice constants of the semiconductor layers are generally matched to one another. Accordingly, when the light-generating layer is formed to have a quantum well structure, a band splitting occurs in the valence band of the light-generating layer, such that the valence band of the light-generating layer has two subbands consisting of a light hole band LH and a heavy hole band HH which has a higher energy level than the light hole band LH. The electrons which are introduced into the light-generating layer with an electric current are stored in the conduction band while the holes introduced into the light-generating layer are stored mainly in the heavy hole band HH, so that excited particles having a relatively high energy level are generated in the light-generating layer. If the electric current applied to the light-emitting diode is increased for increasing its optical output, the number of the excited particles having the high energy level increases with an increase in the magnitude of the electric current, thereby causing the continuously induced or stimulated emission in the light resonator, which results in the laser oscillation.

SUMMARY OF THE INVENTION

It is therefore an object of the present invention to provide a quantum well type light-emitting diode having a light reflector in which there is disposed at least one light-generating layer of a quantum well structure, which light-emitting diode does not suffer from laser oscillation even when the light-emitting diode provides a relatively large optical output.

As a result of an extensive study by the inventor of the present invention, it has been found that if the light-generating layer is given a compressive strain in its direction of thickness, due to a difference of the lattice constant of the at least one light-generating layer from that of two layers which are located adjacent to and on opposite sides of the light-generating layer, the energy levels of the two subbands, i.e., the light-hole band LH and the heavy hole band HH in the valence band of the light-generating layer are made close to each other, to thereby prevent the laser oscillation. The present invention was made based on this finding.

The above-described object of the present invention may be attained according to a first aspect of the invention, which provides a quantum well type light-emitting diode having a light-emitting portion and formed of a plurality of semiconductor layers including at least one light-generating layer of a quantum well structure for generating a light, and a pair of reflecting layers between which the at least one light-generating layer is interposed for reflecting the light generated by the at least one light-generating layer, so that the pair of reflecting layers functions as a light resonator, the quantum well type light-emitting diode emitting the light generated by the light-generating layer from the light-emitting portion, wherein the improvement comprises: each of the at least one light-generating layer having a lattice constant which is smaller than that of at least two semiconductor layers of the plurality of semiconductor layers, which two semiconductor layers are located adjacent to and on opposite sides of the at least one light-generating layer.

In the light-emitting diode constructed according to the above first aspect of the present invention wherein the lattice constant of the light-generating layer is smaller than that of the two layers which are located adjacent to and on the opposite sides of the light-generating layer, the light-generating layer having a relatively small thickness is strained in a direction parallel to its plane, such that the lattice interval of the crystal of the light-generating layer is equal to that of the crystal of the adjacent two layers which are located on the opposite sides of the light-generating layer, whereby the light-generating layer is given a compressive strain acting in its thickness direction. In this state, the energy levels of the light hole band LH and the heavy hole band HH in the valence band of the light-generating layer are made close to each other, so that the holes introduced into the light-generating layer are stored or accumulated in both of the light and heavy hole bands LH and HH of the valance band, resulting in a lowered level of the excitation energy of the holes. Accordingly, the present arrangement advantageously prevents the laser oscillation even when a large amount of holes are introduced into the light-generating layer upon application of a relatively large amount of electric current to the light-emitting diode since the number of the high-energy particles which cause the continuously induced or stimulated emission is relatively small.

The above-described object of the present invention may also be attained according to a second aspect of the invention, which provides a quantum well type light-emitting diode having a light-emitting portion and formed of a plurality of semiconductor layers including at least one light-generating layer of a quantum well structure for generating a light, and a pair of reflecting layers between which the at least one light-generating layer is interposed for reflecting the light generated by the at least one light-generating layer, so that the pair of reflecting layers functions as a light resonator, the quantum well type light-emitting diode emitting the light generated by the light-generating layer from the light-emitting portion, wherein the improvement comprises: each of the at least one light-generating layer being given a compressive strain and is thereby compressed in a direction of thickness thereof.

In the thus constructed light-emitting diode wherein the light-generating layer is given a compressive strain acting in its thickness direction, the energy levels of the light hole band LH and the heavy hole band HH in the valence band of the light-generating layer are made close to each other, so that the introduced holes are stored in both of the light and heavy hole bands LH and HH of the valence band, resulting in a lowered level of the excitation energy of the holes. Accordingly, the present arrangement advantageously prevents the laser oscillation even when a large amount of holes are introduced into the light-generating layer upon application of a relatively large amount of electric current to the light-emitting diode since the number of the high-energy particles which cause the continuously induced or stimulated emission is relatively small.

The above-described object of the present invention may also be attained according to a third aspect of the present invention, which provides a quantum well type light-emitting diode having a light-emitting portion and formed of a plurality of semiconductor layers including at least one light-generating layer of a quantum well structure for generating a light, and a pair of reflecting layers between which the at least one light-generating layer is interposed for reflecting the light generated by the at least one light-generating layer, so that the pair of reflecting layers functions as a light resonator, the quantum well type light-emitting diode emitting the light generated by the light-generating layer from the light-emitting portion, wherein the improvement comprises: each of the at least one light-generating layer having a valence band which is split into two subbands consisting of a light hole band (LH) and a heavy hole band (HH), the light hole band and the heavy hole band having energy levels which are substantially equal to each other.

In the thus constructed light-emitting diode wherein the energy levels of the light hole band LH and the heavy hole band HH in the valence band of the light-generating layer are made substantially equal to each other, the holes which are introduced into each light-generating layer are stored or accumulated in both of the light and heavy hole bands LH and HH. Accordingly, the present arrangement advantageously prevents the laser oscillation even when a large amount of holes are introduced into the light-generating layer upon application of a relatively large amount of electric current to the light-emitting diode since the number of the high-energy particles which cause the continuously induced or stimulated emission is relatively small.

In one preferred form of the above first, second, and third aspects of the present invention, the light-generating layer is given the compressive strain within a range of 0.4–0.5%. According to this arrangement, the energy levels of the light and heavy hole bands LH and HH in the valence band of the light-generating layer are made substantially equal to each other. If the light-generating layer is given the compressive strain smaller than 0.4%, the energy level of the light hole band LH is not as high as that of the heavy hole band HH. If the light-generating layer is given the compressive strain larger than 0.5%, the energy level of the light hole band LH is excessively higher than that of the heavy hole band HH, undesirably causing the laser oscillation.

In another preferred form of the above-described first, second, and third aspects of the present invention, the pair of reflecting layers consists of a first reflecting layer and a second reflecting layer, the first reflecting layer consisting of a multiplicity of unit semiconductors which are formed by crystal growth on a monocrystalline GaAs substrate and which constitute a first distributed-Bragg reflector which is located on the side of the substrate, each of the at least one light-generating layer of a quantum well structure being interposed between two semiconductor barrier layers which are formed by crystal growth, the second reflecting layer consisting of a multiplicity of unit semiconductors which are formed by crystal growth on an upper one of the two barrier layers between which an uppermost one of the at least one light-generating layer is interposed, the multiplicity of unit semiconductors of the second reflecting layer constituting a second distributed-Bragg reflector which is located on the side of the light-emitting portion.

According to this arrangement, the light generated in the light-generating layer is emitted from the light-emitting portion of the light-emitting diode after the light is resonated in the light resonator constituted by the pair of the reflecting layers between which the light-generating layer is interposed.

In still another preferred form of the above-described first through third aspects of the present invention, the at least one light-generating layer is formed in the light-emitting diode such that each of the at least one light-generating layer is aligned with a corresponding one of at least one antinode of a standing wave generated in the light resonator.

This arrangement effectively increases the quantum efficiency of the light-emitting diode, resulting in a significantly high degree of light emission output of the diode.

BRIEF DESCRIPTION OF THE DRAWINGS

The above and optional objects, features and advantages of the present invention will be better understood by reading the following detailed description of presently preferred embodiments of the invention when considered in conjunction with the accompanying drawings in which.

DETAILED DESCRIPTION OF THE PREFERRED EMBODIMENTS

Figure 1:
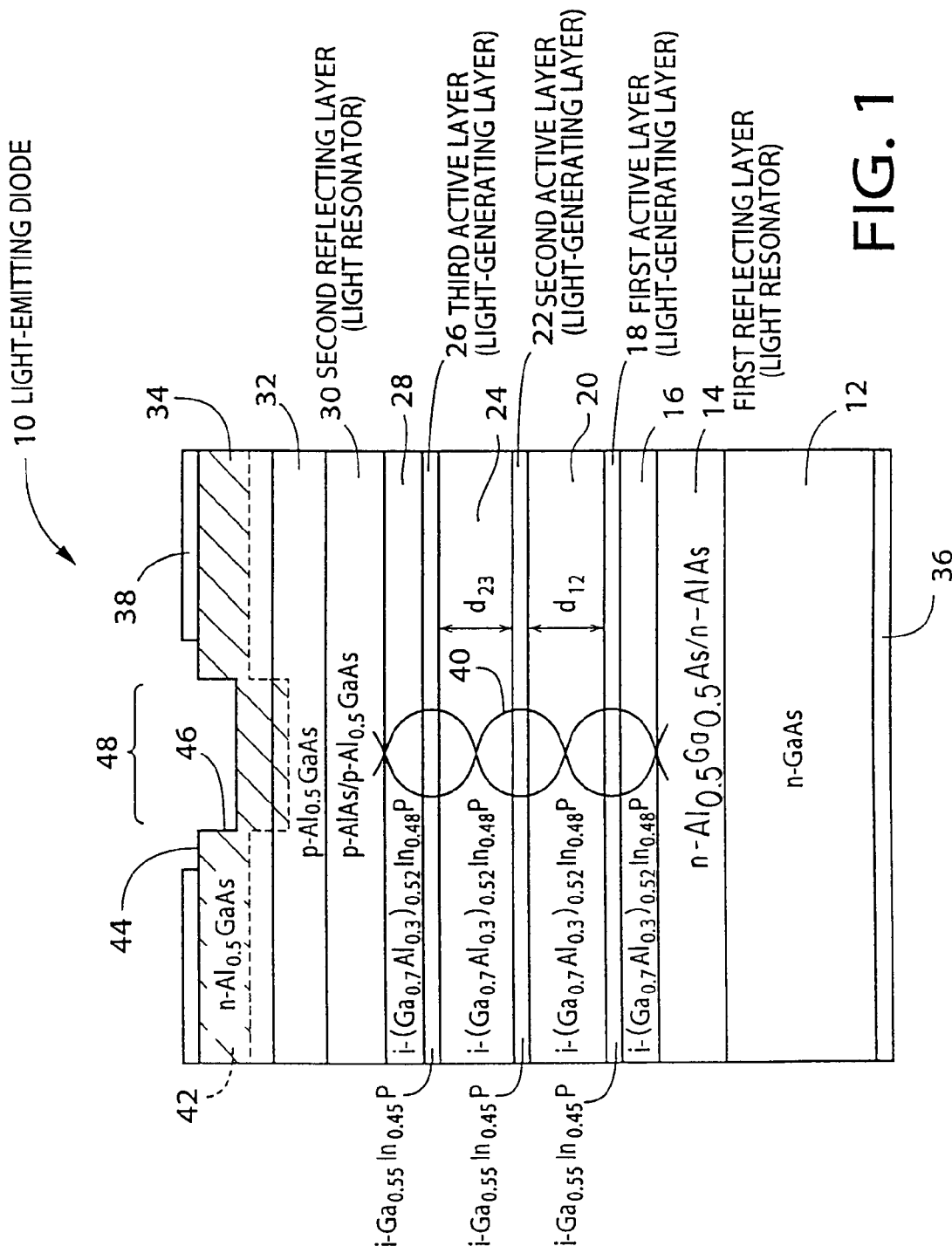
FIG. 1 is a view illustrating a quantum well type light-emitting diode constructed according to one embodiment of the present invention.

Referring first to FIG. 1, there is shown a quantum well type light-emitting diode, in other words, a surface emitting diode 10 (hereinafter referred to simply as "light-emitting diode") constructed according to one embodiment of the present invention. It is noted that the dimensions of the components of the light-emitting diode 10 shown in FIG. 1 are not necessarily accurately represented.

The light-emitting diode 10 includes a monocrystalline semiconductor substrate 12 and a plurality of semiconductor layers consisting of a first reflecting layer 14, a first barrier layer 16, a first active layer 18, a second barrier layer 20, a second active layer 22, a third barrier layer 24, a third active layer 26, a fourth barrier layer 28, a second reflecting layer 30, a cladding layer 32, and a current blocking layer 34, which are formed in the order of description on the substrate 12 by an epitaxial crystal growth technique such as Metal Organic Chemical Vapor Deposition (MOCVD). The light-emitting diode 10 further includes a lower electrode 36 and an upper electrode 38, which are formed by sputtering on the lower surface of the substrate 12 and the upper surface of the current blocking layer 34, respectively. The light-emitting diode 10 has a light-emitting portion 48 which will be described, on one of its opposite ends which is remote from the substrate 12.

The substrate 12 is an n-type compound semiconductor formed of an n-GaAs single crystal and having a thickness of about 350 $\mu$m, for instance. The first reflecting layer 14 which is formed on the substrate 12 consists of a multiplicity of unit semiconductors, e.g., 30 pairs of unit semiconductors, each unit semiconductor consisting of an n-AlAs compound semiconductor monocrystalline film having a thickness of about 49 nm and an n-Al$_{0.5}$Ga$_{0.5}$As compound semiconductor monocrystalline film having a thickness of about 42 nm. These two compound semiconductor films are alternately superposed on each other in this order on the substrate 12 so as to provide the multiplicity of unit semiconductors, so that the first reflecting layer 14 functions as an n-type distributed-Bragg reflector (DBR). The thickness values of the two compound semiconductor films of each unit semiconductor of the reflecting layer 14 are determined to be equal to about one fourth (¼) of the resonance wavelength of the light resonator which will be described.

The first through fourth barrier layers 16, 20, 24, 28 are i-(GA$_{0.7}$Al$_{0.3}$)$_{0.52}$In$_{0.48}$P compound semiconductor monocrystalline layers, and are superposed on each other such that the adjacent two layers sandwich the corresponding one of the first, second, and third active layers 18, 22, 26 therebetween. The first and fourth barrier layers 16, 28 have a thickness value of about 43 nm while the second and third barrier layers 20, 24 have a thickness value of about 86 nm. In other words, a distance d$_{12}$ (FIG. 1) between the first and second active layers 18, 22 which corresponds to the thickness of the second barrier layer 20 and a distance d$_{23}$ (FIG. 1) between the second and third active layers 22, 26 which corresponds to the thickness of the third barrier layer 24 are about 86 nm, which value is equal to about one half (½) of a peak wavelength of a composite light which is composed of the lights generated by the active layers 18, 22, 26 and which is emitted from the light-emitting portion 48, i.e., about one half of the resonance wavelength.

The first, second, and third active layers 18, 22, 26 each of which is interposed between the corresponding adjacent two of the first through fourth barrier layers 16, 20, 24, 28 are quantum wells formed of i-GA$_{0.55}$In$_{0.45}$P compound semiconductor monocrystalline layers. The thickness values of the first through third active layers 18, 22, 26 are determined such that the active layers 18, 22, 26 provide the quantum wells whose energy levels are discontinuous with one another. For instance, the thickness values of the first, second, and third active layers 18, 22, 26 are about 8.3 nm, 6.1 nm, and 4.4 nm, respectively, which values are sufficiently smaller than the wavelength of the electron wave, i.e., 100 nm. Accordingly, the peak wavelengths of the emission spectra of the active layers 18, 22, 26 at the room temperature are about 625 nm, 615 nm, and 607 nm, respectively. In the present embodiment, the active layers 18, 22, 26 function as light-generating layers of a quantum well structure.

Like the first reflecting layer 14 on the side of the substrate 12, the second reflecting layer 30 on the side of the light-emitting portion 48 consists of a multiplicity of unit semiconductors, e.g., 10 pairs of unit semiconductors, each unit semiconductor consisting of a p-AlAs compound semiconductor monocrystalline film having a thickness of about 49 nm and a p-Al$_{0.5}$Ga$_{0.5}$As compound semiconductor monocrystalline film having a thickness of about 42 nm. These two compound semiconductor films are alternately superposed on each other so as to provide the multiplicity of unit semiconductors, so that the second reflecting layer 30 functions as a p-type distributed-Bragg reflector (DBR) In the present embodiment, the pair of reflecting layers 14, 30 constitutes a light resonator, and a distance between the two layers 14, 30, in other words, a length L of the light resonator is about 915 nm, as measured when the light resonator is in vacuum wherein the refractive index n=1. The length L (=915 nm) of the light resonator is about 1.5 times the peak wavelength (=610 nm) of the spectrum of the composite light which is composed of the lights generated by the active layers 18, 22, 26 and which is emitted from the light-emitting portion 48. According to this arrangement, the lights generated by the active layers 18, 22, 26 are repeatedly reflected by and between the first and second reflecting layers 14, 30, to thereby produce a standing wave 40, as shown in FIG. 1. Since the length L of the light resonator and the thickness values of the first through fourth barrier layers 16, 20, 24, 28 are determined as described above, the active layers 18, 22, 26 are aligned with respective antinodes of the standing wave 40, as shown in FIG. 1. In the present embodiment wherein the semiconductor layers (16–28) within the light resonator (14, 30) are substantially formed of a compound semiconductor of InGaAlP, the diffusion length of the carriers (electrons or holes) in the light resonator is about 0.5 $\mu$m, and the coherent length of the electrons is about 50 nm. In this arrangement, the distance d$_{12}$ between the first and second active layers 18, 22 and the distance d$_{23}$ between the second and third active layers 22, 26 are sufficiently smaller than the diffusion length of the carriers, and sufficiently larger than the coherent length of the electrons.

The cladding layer 32 is a p-$Al_{0.5}Ga_{0.5}As$ compound semiconductor monocrystalline layer having a thickness value of about 2 μm while the current blocking layer 34 is an n-$Al_{0.5}Ga_{0.5}As$ compound semiconductor monocrystalline layer having a thickness value of about 1 μm. Portions of the cladding layer 32 and the current blocking layer 34 indicated by hatched lines in FIG. 1 are doped with a p-type dopant impurity such as Zn, to thereby form a diffusion area 42 in which the impurity is diffused in a high concentration. In this diffusion area 42, the conductivity of the cladding layer 32 is increased while the polarity of the current blocking layer 34 is changed to the p-type. In the thus formed light-emitting diode 10, there is formed a narrow or restricted current flow path in a central portion of the current blocking layer 34, in which the p-type impurity is diffused to change the polarity from the n-type into the p-type, over the entire thickness down to the interface with the cladding layer 32. The electric current can flow through only this narrow current flow path of the current blocking layer 34 when the diode 10 is energized.

The lower electrode 36 has a thickness of about 1 μm and is formed of a laminar structure consisting of a Au—Ge alloy, Ni and Au which are superposed on one another in the order of description on the substrate 12, so as to cover the entirety of the lower surface of the substrate 12. The upper electrode 38 has a thickness of about 1 μm and is formed of a laminar structure consisting of a Au—Zn alloy and Au which are superposed on each other in the order of description on the upper surface 44 of the current blocking layer 34 except a circular central portion corresponding to the width of the above-described narrow current flow path. The lower and upper electrodes 36, 38 are ohmic electrodes.

The circular central portion of the current blocking layer 34 on which the upper electrode 38 is not provided is formed with a recess 46 having a diameter of about 50 μm. The lights generated by the light-generating layers are emitted from the light-emitting portion 48 corresponding to this recess 46. The bottom of the recess 46 defines the upper end of the above-described narrow current flow path, the diameter of which is equal to that of the light-emitting portion 48. The recess 46 is formed by etching, for instance, for the purpose of increasing the depth of diffusion of the impurity into the central portion of the current blocking layer 34 through its upper surface 44 down into cladding layer 32.

The light-emitting diode 10 described above is produced in the following manner, for instance. Initially, all layers from the first reflecting layer 14 through the current blocking layer 34 are formed by crystal growth on the substrate 12 by the MOCVD method, for instance, so as to form an epitaxial wafer. Then, a resist is applied to cover the upper surface 44 of the current blocking layer 34 except the circular central portion having the diameter of 50 μm. The surface 44 is subjected to an etching operation by using an etching liquid consisting of ammonium and an aqueous solution of hydrogen peroxide, whereby the circular central portion of the current blocking layer 34 which is not covered by the resist is etched so as to form the above-described recess 46.

After the resist is removed from the surface 44 of the current blocking layer 34, Zn as the dopant impurity is diffused in the current blocking layer 34 by thermal diffusion such as a sealed tube diffusion method. More specifically described, in the outer peripheral portion of the current blocking layer 34 which has the original thickness, namely the portion wherein the recess 46 is not formed, only an upper half thickness portion of the current blocking layer 34 is doped with the Zn. In the circular central portion of the current blocking layer 34 wherein the recess 46 is formed by etching, the Zn is diffused down into an upper half thickness portion of the cladding layer 32, beyond the boundary between the current blocking layer 34 and the cladding layer 32, so that the circular central portion of the current blocking layer 34 is doped with the Zn through the entire thickness thereof, so as to provide the above-described narrow current flow path. Thus, there is formed the diffusion area 42 in which the Zn is diffused in a high concentration. In effecting the thermal diffusion of the Zn, the epitaxial wafer is put into a quarts ampul together with a diffusion source (e.g., $ZnAs_2$), and the ampul is sealed in vacuum. Then, the ampul is heated in an electric furnace and held at about 600° C. for twenty-four hours. After the lower and upper electrodes 36, 38 are formed on the lower surface of the substrate 12 and the upper surface of the current blocking layer 34, respectively, the epitaxial wafer is cut by dicing into a plurality of pieces corresponding to the individual light-emitting diodes 10. The obtained light-emitting diode 10 is die-bonded to a TO18 flat stem not shown while it is sealed. In this state, the light-emitting diode 10 is operated by applying a positive voltage to the upper electrode 38 and a negative voltage to the lower electrode 36.

Figure 2:
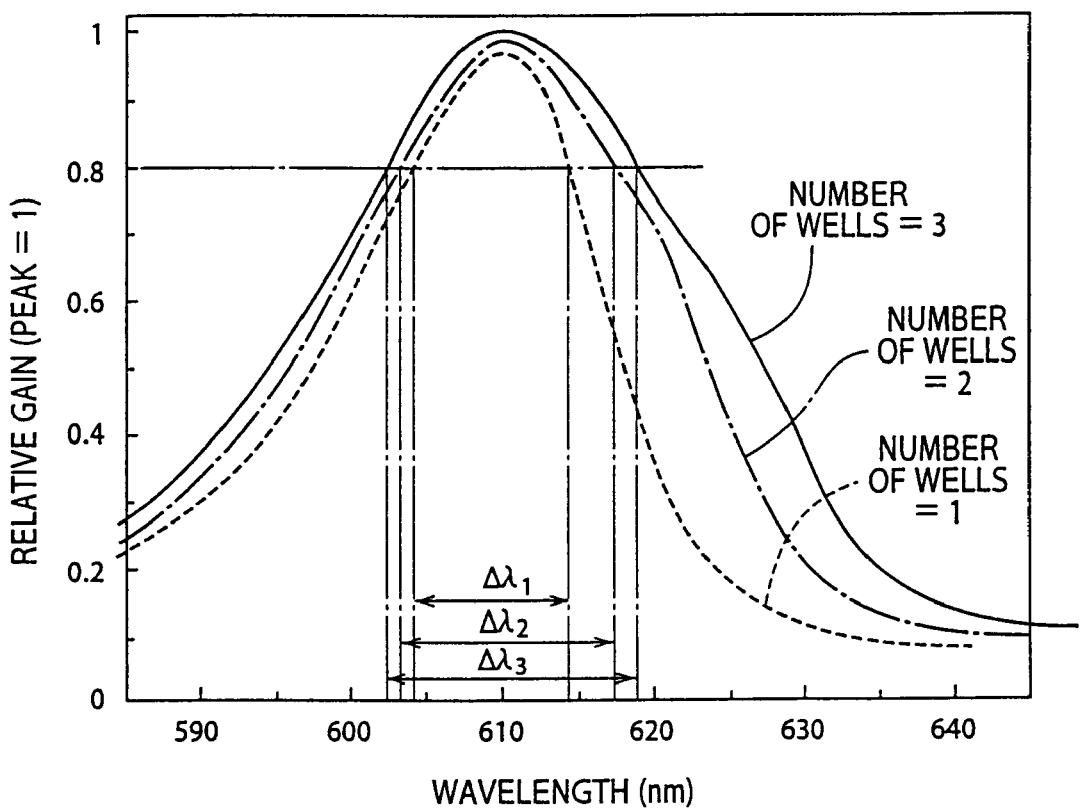
FIG. 2 is a graph showing a gain spectrum of the light-emitting diode of FIG. 1 having three wells, as compared with gain spectra of other light-emitting diodes having different numbers of wells.

Referring next to FIG. 2, there is shown a graph indicating light emission spectra of three light-emitting diodes having different numbers of wells as indicated in the following Table. Described more specifically, the emission spectrum of the light-emitting diode 10 having three wells and constructed according to the present embodiment is indicated by a solid line in the graph of FIG. 2 while the emission spectrum of the light-emitting diode having two wells and constructed according to another embodiment of the present invention is indicated by a one-dot chain line. Further, the emission spectrum of the light-emitting diode having one well and constructed as a comparative example is indicated by a broken line. As is apparent from the graph of FIG. 2, the light-emitting diode as the comparative example (indicated by the broken line) has a relatively small wavelength width $\Delta\lambda_1$=12 nm at 80% of the relative gain whose peak is equal to 1, whereas the light-emitting diode 10 of the present invention (indicated by the solid line) has a relatively large wavelength width $\Delta\lambda_3$=17 nm at 80% of the relative gain. Accordingly, the temperature range in which the gain is 80% or more is relatively large (range≑142° C.) in the light-emitting diode 10 of the present invention, as compared with the temperature range (range≑110° C.) in the comparative light-emitting diode.

| Number of well | Width of well | Peak wavelength of each well | | [nm] | Peak wavelength | Wavelength width | Temperature range |
|---|---|---|---|---|---|---|---|
| 1 | 5.0 (610) | | | | 610 nm | 12 nm | 100° C. |
| 2 | 4.5 (608) | 6.7 (618) | | | 610 nm | 14 nm | 117° C. |
| 3 | 4.4 (607) | 6.1 (615) | 8.3 (625) | | 610 nm | 17 nm | 142° C. |

In the present light-emitting diode 10, with a voltage applied between the lower electrode 36 and the upper electrode 38, an electric current flows in a direction from the upper portion to the lower portion of the diode through the narrow current flow path as described above, so that the active layers 18, 22, 26 are excited to generate lights. Since the light-generating layers in the form of the active layers 18, 22, 26 formed of respective different quantum wells are disposed within the light resonator (microresonator) constituted by the pair of reflecting layers 14, 30, each of the active layers 18, 22, 26 generates a light having a relatively small width of emission spectrum at the wavelength which satisfies the resonance condition. In the present light-emitting diode 10 wherein the light-generating layers, i.e., the active layers 18, 22, 26 are formed of the respective different quantum wells having respective different thickness values, the peak wavelengths of the lights generated by the respective active layers 18, 22, 26 are different from one another as shown in the above Table. Accordingly, the emission spectrum of the composite light which is composed of the lights generated by the active layers 18, 22, 26 and which is emitted from the light-emitting portion 48 consists of a combination of the emission spectra of the lights generated by the respective active layers (light-generating layers), which emission spectra are superimposed on one another, so that the wavelength width over which the gain is obtained is larger in the emission spectrum consisting of the combination of the three emission spectra than that in the emission spectrum of each active layer (light-generating layer). The peak wavelength of the composite light whose emission spectrum consists of the combination of the three emission spectra of the respective three active layers 18, 22, 26 is about 610 nm, for example. In other words, the peak value in the wavelength range over which the gain is obtained is about 610 nm.

In the present light-emitting diode 10 shown in FIG. 1 wherein the distance $d_{12}$ between the first and second active layers 18, 22 and the distance $d_{23}$ between the second and third active layers 22, 26 are 86 nm, the optical length corresponding to the distances $d_{12\ and\ d23}$ are equal to about one half (½) of the resonance wavelength, i.e., about one half of the peak wavelength of the above-described composite light. This arrangement prevents the quantum wells from being coupled together, thereby avoiding formation of another energy level since the distances $d_{12}$ and $d_{23}$ are sufficiently larger than the coherent length of the electrons in the light resonator. Accordingly, the emission spectra of the active layers 18, 22, 26 do not change due to a mutual interference. In this arrangement, the gain spectrum (emission spectrum) of the light-emitting diode 10 corresponds to the combination of the three different emission spectra of the respective three active layers 18, 22, 26, which emission spectra are superimposed on one another. The present arrangement permits the light-emitting diode 10 to have the desired gain spectrum (emission spectrum) by providing the different three active layers 18, 22, 26 having the respective different emission spectra which are to be combined with one another to provide the gain spectrum of the light-emitting diode 10. In other words, in the present light-emitting diode 10, the material and the thickness of the active layers 18, 22, 26 are determined such that the light-emitting diode 10 has the emission spectrum indicated by the solid line in the graph of FIG. 2. In the present light-emitting diode 10 wherein the active layers 18, 22, 26 are formed of the $Ga_{0.55}In_{0.45}P$ compound semiconductors and the first through fourth barrier layers 16, 20, 24, 28 are formed of the $(Ga_{0.7}Al_{0.3})_{0.52}In_{0.48}P$ compound semiconductors, the coherent length of the electrons in the light resonator is about 50 nm.

The distance $d_{12}$ between the first and second active layers 18, 22 and the distance $d_{23}$ between the second and third active layers 22, 26 are equal to about one half of the resonance wavelength of the light resonator. In this arrangement, the quantum wells of the light-generating layers (active layers 18, 22, 26) are located in alignment with the respective antinodes of the standing wave 40, as shown in FIG. 1, so that the light-emitting diode 10 assures a significantly high degree of emission output. The above-described distances $d_{12}$ and $d_{23}$ are made smaller than the diffusion length of the carriers in the light resonator (about 0.5 μm in the present embodiment), so that the carriers are sufficiently diffused into all of the quantum wells (active layers 18, 22, 26), beyond the barrier layers, resulting in a considerably high degree of emission output of the light-emitting diode 10.

In the present light-emitting diode 10 wherein the active layers 18, 22, 26 functioning as the light-generating layers are formed of the i-$Ga_{0.55}In_{0.45}P$ monocrystalline layers while the first through fourth barrier layers 16, 20, 24, 28 each of which sandwiches the corresponding active layer 18, 22, 26 therebetween are formed of the i-$(Ga_{0.7}Al_{0.3})_{0.52}In_{0.48}P$ monocrystalline layers, the lattice constant $d_A$ (=5.6391 Å) of the active layers 18, 22, 26 is made smaller than the lattice constant $d_B$ (=5.6516 Å) of the barrier layers 16, 20, 24, 28 which are located adjacent to and on the opposite sides of the corresponding active layers 16, 20, 24, 28. In this arrangement, each of the active layers 18, 22, 26 is strained in a direction parallel to its plane, so that the active layers 18, 22, 26 are given a compressive strain of 0.4–0.5% in the direction of thickness. In this arrangement, the energy levels of the light hole band LH and the heavy hole band HH of the valence band of each active layer 18, 22, 26 are made substantially equal to each other. In other words, the energy levels of the light and heavy hole bands LH, HH of the valence band of each active layer 18, 22, 26 are close to each other to such an extent that the light-emitting diode 10 assures the optical output with high stability while preventing the laser oscillation. If the compressive strain acting on each active layer 18, 22, 26 is smaller than 0.4%, the energy level of the light hole band LH is not sufficiently close to that of the heavy hole band HH. On the other hand, if the compressive strain exceeds 0.5%, the energy level of the light hole band LH is excessively higher than that of the heavy hole band HH, whereby the light-emitting diode 10 undesirably suffers from the laser oscillation.

Figure 3:
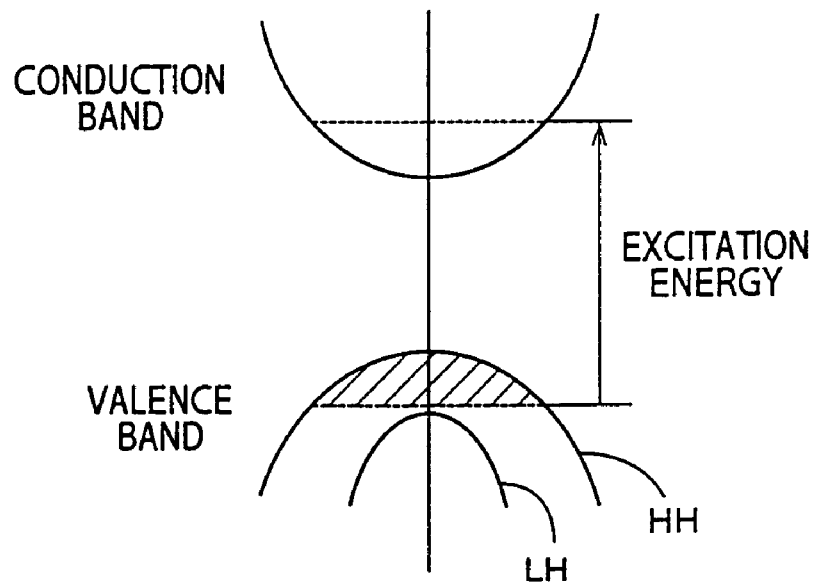
FIG. 3 is a view schematically explaining the energy band of the active layer of a conventional light-emitting diode wherein the lattice constant of the active layer matches that of the barrier layers which sandwich the active layer therebetween.
Figure 4:
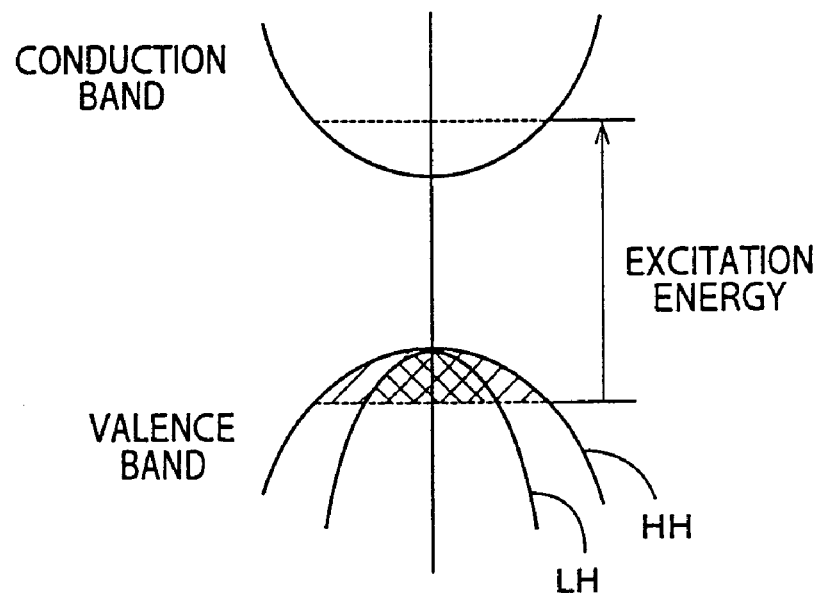
FIG. 4 is a view schematically explaining the energy level of the active layer of the light-emitting diode of FIG. 1, wherein the lattice constant of the active layer is smaller than that of the barrier layers which sandwich the active layer therebetween, so that the active layer is given a compressive strain.

In general, the lattice constant $d_A$ of the active layers is made equal to the lattice constant $d_B$ of the first through fourth barrier layers 16, 20, 24, 28, by forming the active layers of the i-$Ga_{0.52}In_{0.48}P$ monocrystalline layers. In this case, the energy band of the valence band of each active layer is split into two subbands whose energy levels are different from each other, i.e., the light-hole band LH and the heavy-hole band HH whose energy level is higher than that of the light-hole band LH, as shown in FIG. 3. In contrast, in the present light-emitting diode 10 wherein the active layers 18, 22, 26 are formed of the i-$Ga_{0.55}In_{0.45}P$ monocrystalline layers, the lattice constant $d_A$ of the active layers 18, 22, 26 is made smaller than the lattice constant $d_B$ of the first through fourth barrier layers 16, 20, 24, 28 which are located adjacent to and on opposite sides of the corresponding active layers 18, 22, 26, so that the active layers 18, 22, 26 are given a compressive strain of 0.4–0.5%. Accordingly, the energy levels of the light-hole band LH and the heavy-hole band HH in the valence band of each of the active layers 18, 22, 26 are made substantially equal to each other, as shown in FIG. 4.

In the conventional light-emitting diode wherein the energy levels of the light-hole band LH and the heavy-hole band HH of the valence band of each active layer are different from each other as shown in FIG. 3, most of the holes introduced into each active layer are stored or accumulated in the heavy-hole band HH, whereby the energy level of the excited holes (excitation energy) is increased, so that the excited particles having a high energy are generated in the light-generating layers. By applying a relatively large magnitude of electric current to the light-emitting diode to cause the diode to generate a large optical output, a large number of the excited particles having a high energy are generated, to thereby cause the continuously stimulated or induced emission in the light resonator. Accordingly, the light-emitting diode suffers from the laser oscillation especially when the diode generates a large optical output by application of a relatively large amount of electric current thereto.

In the light-emitting diode 10 of the present invention, the lattice constant $d_A$ of the active layers 18, 22, 26 having the respective thickness values which are sufficiently smaller than those of the first through fourth barrier layers 16, 20, 24, 28 is made smaller than the lattice constant $d_B$ of the barrier layers 16, 20, 24, 28 which are located adjacent to and on opposite sides of the corresponding active layers 18, 22, 26, so that the active layers 18, 22, 26 are given a compressive strain of 0.4–0.5%. In other words, each of the active layers 18, 22, 26 is strained in the direction parallel to its plane, so that the lattice interval of each active layer 18, 22, 26 matches the lattice interval of the barrier layers 16, 20, 24, 28 which sandwich the active layers 18, 22, 26 therebetween. Accordingly, the active layers 18, 22, 26 are given the compressive strain in the direction of thickness. In this arrangement, the energy levels of the light-hole band LH and the heavy-hole band HH in the valence band of each active layer 18, 22, 26 are close to each other, and made substantially equal to each other, so that the introduced holes are stored or accumulated in both of the light-hole band LH and the heavy-hole band HH, resulting in a lowered energy level of the excited holes. Since the number of the particles having a high energy is not large enough to cause the continuously stimulated or induced emission even when a large amount of holes are introduced into each active layer 18, 22, 26 by application of a relatively large magnitude of electric current to the light-emitting diode 10, the present light-emitting diode 10 is capable of generating the optical output with high stability without suffering from the laser oscillation.

While the present invention has been described in its preferred embodiments, the invention may be otherwise embodied.

While the light-emitting diode 10 in the embodiment of FIG. 1 has the three active layers 18, 22, 26 formed of the quantum wells, which active layers 18, 22, 26 are sandwiched by and between the corresponding two of the first through fourth barrier layers 16, 20, 24, 28, the number of the active layers is not limited to that in the embodiment of FIG. 1. The light-emitting diode 10 may have one or two active layers. Alternatively, the light-emitting diode 10 may have four or more active layers. Further, two or more active layers may be provided in alignment with the respective antinodes of the standing wave 40 generated in the light resonator.

The distance between the adjacent two active layers are not limited to about one half of the resonance wavelength as in the illustrated embodiment of FIG. 1, but may be suitably changed as long as it is longer than the coherent length of the electrons. For permitting the light-emitting diode 10 to exhibit the emission efficiency as high as possible, the distance between the adjacent two active layers is preferably shorter than the diffusion length of the carriers. More preferably, the distance between the adjacent two active layers is about one half of the resonance wavelength.

The light-emitting diodes in the illustrated embodiments have an InAlGaAs structure wherein the semiconductor layers such as the active layer 18 is formed of the $Ga_{0.55}In_{0.45}P$ compound semiconductor. The principle of the present invention is be applicable to other types of light-emitting diode wherein the semiconductor layers are formed of an AlGaAs single crystal, a GaAsP single crystal or an InGaAsP single crystal.

In the illustrated embodiment of FIG. 1, the pair of reflecting layers consists of the first and second reflecting layers 14, 30 which are formed of the respective multilayered semiconductor reflecting layers. The pair of reflecting layers may consist of dielectric layers or metallic layers.

The light-emitting diode 10 of the illustrated embodiment is a point light source type diode wherein the generated light is emitted from only the light-emitting portion 48 formed at the central portion of the upper surface 44 of the current blocking layer 34. The principle of the present invention is applicable to other diodes such as a surface emitting diode wherein the generated light is emitted from the entire surface of the upper surface 44.

It is to be understood that the present invention may be embodied with various changes, modifications and improvements that may occur to those skilled in the art without departing from the scope and spirit of the invention defined by the appended claims.

What is claimed is:

1. A quantum well type light-emitting diode having a light-emitting portion and formed of a plurality of semiconductor layers including at least one light-generating layer of a quantum well structure configured to generate a light, and a pair of reflecting layers between which said at least one light-generating layer is interposed for reflecting said light generated by said at least one light-generating layer, so that said pair of reflecting layers functions as a light resonator, said quantum well type light-emitting diode emitting said light generated by said light-generating layer from said light-emitting portion, wherein the improvement comprises:

each of said at least one light-generating layer having a lattice constant which is smaller than that of at least two semiconductor layers of said plurality of semiconductor layers, said at least two semiconductor layers are located adjacent to and on opposite sides of said at least one light-generating layers;

each of said at least one light-generating layer being a GaInP compound semiconductor monocrystalline layer while each of said at least two semiconductor layers is a GaAlInP compound semiconductor monocrystalline layer; and each of said at least one light-generating layer being given a compressive strain within a range of 0.4–0.5% and thereby compressed in a direction of thickness thereof.

2. A quantum well type light-emitting diode according to claim 1, wherein said pair of reflecting layers consists of a first reflecting layer and a second reflecting layer, said first reflecting layer consisting of a multiplicity of unit semiconductors which are formed by crystal growth on a monocrystalline GaAs substrate and which constitute a first distributed-Bragg reflector which is located on a side of said substrate, each of said at least one light-generating layer of a quantum well structure being interposed between two semiconductor barrier layers which are formed by crystal growth, said second reflecting layer consisting of a multiplicity of unit semiconductors which are formed by crystal growth on an upper one of said two barriers layers between which an uppermost one of said at least one light-generating layer is interposed, said multiplicity of unit semiconductors of said second reflecting layer constituting a second distributed-Bragg reflector which is located on a side of said light-emitting portion.

3. A quantum well type light-emitting diode according to claim 1, wherein said at least one light-generating layer is formed in said light-emitting diode such that each of said at least one light-generating layer is aligned with a corresponding one of at least one antinode of a standing wave generated in said light resonator.

4. A quantum well type light-emitting diode having a light-emitting portion and formed of a plurality of semiconductor layers including at least one light-generating layer of a quantum well structure configured to generate a light, and a pair of reflecting layers between which said at least one light-generating layer is interposed for reflecting said light generated by said at least one light-generating layer, so that said pair of reflecting layers functions as a light resonator, said quantum well type light-emitting diode emitting said light generated by said light-generating layer from said light-emitting portion, wherein the improvement comprises:

each of said at least one light-generating layer having a valence band which is split into two subbands consisting of a light hole band (LH) and a heavy hole band (HH), said light hole band and said heavy hole band having energy levels which are substantially equal to each other;

each of said at least one light-generating layer being interposed between at least two semiconductor layers of said plurality of semiconductor layers, said at least two semiconductor layers are located adjacent to and on opposite sides of said each light-generating layer, each of said at least one light-generating layer being a GaInP compound semiconductor monocrystalline layer while each of said at least two semiconductor layers is a GaAlInP compound semiconductor monocrystalline layer; and each of said at least one light-generating layer being given a compressive strain within a range of 0.4–0.5% and thereby compressed in a direction of thickness thereof.

5. A quantum well type light-emitting diode according to claim 4, wherein said pair of reflecting layers consists of a first reflecting layer and a second reflecting layer, said first reflecting layer consisting of a multiplicity of unit semiconductors which are formed by crystal growth on a monocrystalline GaAs substrate and which constitute a first distributed-Bragg reflector which is located on a side of said substrate, each of said at least one light-generating layer of a quantum well structure being interposed between two semiconductor barrier layers which are formed by crystal growth, said second reflecting layer consisting of a multiplicity of unit semiconductors which are formed by crystal growth on an upper one of said two barrier layers between which an uppermost one of said at least one light-generating layer is interposed, said multiplicity of unit semiconductors of said second reflecting layer constituting a second distributed-Bragg reflector which is located on a side of said light-emitting portion.

6. A quantum well type light-emitting diode according to claim 4, wherein said at least one light-generating layer is formed in said light-emitting diode such that each of said at least one light-generating layer is aligned with a corresponding one of at least one antinode of a standing wave generated in said light resonator.

7. A quantum well light-emitting diode comprising:
a light-emitting portion; and
a plurality of semiconductor layers including,
at least two light-generating layers of a quantum well structure configured to generate a light, and
a pair of reflecting layers between which said at least two light-generating layers are interposed,
wherein said pair of reflecting layers is configured to reflect said light generated by said at least two light-generating layers so that said pair of reflecting layers functions as a light resonator, said quantum well light-emitting diode emits said light generated by said at least two light-generating layers from said light-emitting portion, and each light-generating layer of said at least two light-generating layers has a lattice constant which is smaller than that of at least two semiconductor layers of said plurality of semiconductor layers with said at least two semiconductor layers located adjacent to and on opposite sides of said each light-generating layer;
each of said at least two light-generating layers being a GaInP compound semiconductor monocrystalline layer while each of said at least two semiconductor layers is a GaAlInP compound semiconductor monocrystalline layer; and
each of said at least two light-generating layers being given a compressive strain within a range of 0.4–0.5% and thereby compressed in a direction of thickness thereof.

8. A quantum well light-emitting diode comprising:
a light-emitting portion;
and a plurality of semiconductor layers including,
at least two light-generating layers of a quantum well structure configured to generate a light, and
a pair of reflecting layers between which said at least two light-generating layers are interposed,
wherein said pair of reflecting layers is configured to reflect said light generated by said at least two light-generating layers so that said pair of reflecting layers functions as a light resonator, said quantum well light-emitting diode emits said light generated by said at least two light-generating layers from said light-emitting portion, and each light-generating layer of said at least two light-generating layers has a valence band which is split into two subbands including a light hole band (LH) and a heavy hole band (HH) with said light hole band and said heavy hole band having energy levels which are substantially equal to each other;
each of said at least two light-generating layers being interposed between at least two semiconductor layers of said plurality of semiconductor layers, said at least two semiconductor layers are located adjacent to and on opposite sides of said each light-generating layer, each of said at least two light-generating layers being a GaInP compound semiconductor monocrystalline layer while each of said at least two semiconductor layers is a GaAlInP compound semiconductor monocrystalline layer; and
each of said at least two light-generating layers being given a compressive strain within a range of 0.4–0.5% and thereby compressed in a direction of thickness thereof.

9. A quantum well light-emitting diode comprising:

a light-emitting portion; and a plurality of semiconductor layers including, at least three light-generating layers of a quantum well structure configured to generate a light, and a pair of reflecting layers between which said at least three light-generating layers are interposed, wherein said pair of reflecting layers is configured to reflect said light generated by said at least three light-generating layers so that said pair of reflecting layers functions as a light resonator, said quantum well light-emitting diode emits said light generated by said at least three light-generating layers from said light-emitting portion, each light-generating layer of said at least three light-generating layers has a lattice constant which is smaller than that of at least two semiconductor layers of said plurality of semiconductor layers, and said at least two semiconductor layers are located adjacent to and on opposite sides of said each light-generating layer;

each of said at least three light-generating layers being a GaInP compound semiconductor monocrystalline layer while each of said at least two semiconductor layers is a GaAlInP compound semiconductor monocrystalline layer; and each of said at least three light-generating layers being given a compressive strain within a range of 0.4–0.5% and thereby compressed in a direction of thickness thereof.

10. A quantum well type light-emitting diode according to claim 9, wherein said at least three light-generating layers consists of three light-generating layers.

11. A quantum well light-emitting diode comprising:

a light-emitting portion;

and a plurality of semiconductor layers including, at least three light-generating layers of a quantum well structure configured to generate a light, and a pair of reflecting layers between which said at least three light-generating layers are interposed, wherein said pair of reflecting layers is configured to reflect said light generated by said at least three light-generating layers so that said pair of reflecting layers functions as a light resonator, said quantum well light-emitting diode emits said light generated by said at least three light-generating layers from said light-emitting portion, each light-generating layer of said at least three light-generating layers has a valence band which is split into two subbands including a light hole band (LH) and a heavy hole band (HH), and said light hole band and said heavy hole band have energy levels which are substantially equal to each other;

each of said at least three light-generating layers being interposed between at least two semiconductor layers of said plurality of semiconductor layers, said at least two semiconductor layers are located adjacent to and on opposite sides of said each light-generating layer, each of said at least three light-generating layers being a GaInP compound semiconductor monocrystalline layer while each of said at least two semiconductor layers is a GaAlInP compound semiconductor monocrystalline layer; and each of said at least three light-generating layers being given a compressive strain within a range of 0.4–0.5% and thereby compressed in a direction of thickness thereof.

12. A quantum well type light-emitting diode according to claim 11, wherein said at least three light-generating layers consist of three light-generating layers.

* * * * *